(12) United States Patent
Sato et al.

(10) Patent No.: US 10,714,670 B2
(45) Date of Patent: Jul. 14, 2020

(54) THERMOELECTRIC CONVERSION MODULE

(71) Applicant: Panasonic Intellectual Property Management Co., Ltd., Osaka (JP)

(72) Inventors: Hiroki Sato, Nara (JP); Tsutomu Kanno, Kyoto (JP); Hiromasa Tamaki, Osaka (JP); Yuriko Kaneko, Nara (JP); Miho Uehara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/426,002

(22) Filed: May 30, 2019

(65) Prior Publication Data

US 2019/0355890 A1 Nov. 21, 2019

Related U.S. Application Data

(63) Continuation of application No. PCT/JP2018/044177, filed on Nov. 30, 2018.

(30) Foreign Application Priority Data

May 21, 2018 (JP) ................................. 2018-096911

(51) Int. Cl.
*H01L 35/32* (2006.01)
*H01L 35/10* (2006.01)

(52) U.S. Cl.
CPC .............. *H01L 35/32* (2013.01); *H01L 35/10* (2013.01)

(58) Field of Classification Search
None
See application file for complete search history.

(56) References Cited

U.S. PATENT DOCUMENTS

2005/0172994 A1* 8/2005 Shutoh ................... H01L 35/20
236/239
2012/0159967 A1* 6/2012 Lee ........................ F25B 21/02
62/3.3

(Continued)

FOREIGN PATENT DOCUMENTS

JP 2016-009779 1/2016
JP 2016-035882 3/2016

OTHER PUBLICATIONS

International Search Report of PCT application No. PCT/JP2018/044177 dated Feb. 19, 2019.

(Continued)

*Primary Examiner* — Eli S Mekhlin
*Assistant Examiner* — Dujuan A Horton
(74) *Attorney, Agent, or Firm* — McDermott Will & Emery LLP

(57) ABSTRACT

The present disclosure provides a thermoelectric conversion module that enables continued use of a thermoelectric generation system even when a part of a plurality of the thermoelectric conversion modules fails by being exposed to a higher temperature. The thermoelectric conversion module according to the present disclosure includes a substrate, a plurality of thermoelectric conversion element pairs electrically connected in series on the substrate, a pair of external terminals that carries out one of inputting and outputting of electric power, and a low melting point conductor. The low melting point conductor has a melting point that is substantially equal to a heat-resistant temperature of a p-type thermoelectric conversion element or an n-type thermoelectric conversion element. One of the pair of external terminals has a first connecting part connecting with the p-type thermoelectric conversion element positioned at one end of the plurality of thermoelectric conversion element pairs, whereas the other of the pair of external terminals has a (Continued)

second connecting part connecting with the n-type thermoelectric conversion element positioned at the other end of the plurality of thermoelectric conversion element pairs. The first and second connecting parts and the low melting point conductor are positioned in an inner region of the substrate. At least a part of the low melting point conductor is positioned between the pair of external terminals and is electrically insulated from at least one of the pair of external terminals.

15 Claims, 5 Drawing Sheets

(56) References Cited

U.S. PATENT DOCUMENTS

| 2012/0167937 | A1* | 7/2012 | Fann | H01L 35/08 |
| | | | | 136/224 |
| 2015/0287901 | A1* | 10/2015 | Lorimer | H01L 35/32 |
| | | | | 136/200 |

OTHER PUBLICATIONS

G. Jeffrey Snyder et al., "Complex thermoelectric materials", Nature Materials, vol. 7, No. 2, Feb. 1, 2008, pp. 105-114.

* cited by examiner

THERMOELECTRIC CONVERSION MODULE

TECHNICAL FIELD

The present disclosure relates to a thermoelectric conversion module.

BACKGROUND ART

A thermoelectric conversion element is capable of converting heat into electric power or converting electric power into heat. A thermoelectric conversion element formed of thermoelectric materials that exhibit the Seebeck effect can obtain thermal energy from a heat source having a relatively low temperature (that is, for example, equal to or lower than 200° C.) for conversion into electric power. Thermoelectric generation technology utilizing such a thermoelectric conversion element can, for example, make it possible to recover and effectively use unused thermal energy that has conventionally been discarded in the form of, for example, steam, hot water, or exhaust gas into an ambient environment.

A thermoelectric conversion device generally has such a so-called "π-shaped structure" that a p-type thermoelectric conversion element and an n-type thermoelectric conversion element form a pair with their carriers having different electrical polarities. This structure is disclosed, for example, in NPL 1. The p-type thermoelectric conversion element and the n-type thermoelectric conversion element of the thermoelectric conversion device having the "π-shaped structure" are electrically connected in series and are thermally connected in parallel. In this specification, the p-type and n-type thermoelectric conversion elements forming the pair are referred to as "thermoelectric conversion element pair". A plurality of the thermoelectric conversion element pairs are electrically connected in series to compose a thermoelectric conversion module. The thermoelectric conversion module includes, for example, several tens of thermoelectric conversion element pairs. By converting thermal energy into electric power, the thermoelectric conversion module provides, for example, a voltage ranging from several millivolts to several volts.

CITATION LIST

Patent Literature

PTL 1: Japanese Patent Application Publication No. 2016-009779
PTL 2: Japanese Patent Application Publication No. 2016-035882

Non-Patent Literature

NPL 1: G. JEFFREY SNYDER and ERIC S. TOBERER, "Complex thermoelectric materials", Nature Materials, Vol. 7, No. 2, 2008, pp. 105-114

SUMMARY OF THE INVENTION

Technical Problem

There are cases where a plurality of thermoelectric conversion modules are electrically connected in series to compose a thermoelectric generation system for more electric power generation. In this thermoelectric generation system, a partial failure of the plurality of thermoelectric conversion modules results in electrical discontinuity of the entire thermoelectric generation system because the plurality of thermoelectric conversion modules are connected in series. Even in such a case, continued use of the thermoelectric generation system is desired.

A thermoelectric conversion module that is provided according to an exemplary embodiment of the present disclosure enables continued use of a thermoelectric generation system even when a part of a plurality of the thermoelectric conversion modules fails by being exposed to a higher temperature.

Solution to Problem

A thermoelectric conversion module according to the present disclosure includes: a substrate; a plurality of thermoelectric conversion element pairs electrically connected in series, the plurality of thermoelectric conversion element pairs being provided on the substrate; a pair of external terminals that carries out inputting or outputting of electric power, the pair of external terminals being provided on the substrate; and a low melting point conductor, wherein each of the plurality of thermoelectric conversion element pairs has a p-type thermoelectric conversion element and an n-type thermoelectric conversion element, the low melting point conductor has a melting point that is substantially equal to a heat-resistant temperature of the p-type thermoelectric conversion element or the n-type thermoelectric conversion element, one of the pair of external terminals has a first connecting part electrically connecting with the p-type thermoelectric conversion element positioned at one end of the plurality of thermoelectric conversion element pairs, whereas the other of the pair of external terminals has a second connecting part electrically connecting with the n-type thermoelectric conversion element positioned at the other end of the plurality of thermoelectric conversion element pairs, the first connecting part and the second connecting part are positioned in an inner region surrounded by an outer region of the substrate, the outer region includes a surface region of the substrate with the surface region being provided with an outermost plurality of the p-type thermoelectric conversion elements and an outermost plurality of the n-type thermoelectric conversion elements, the low melting point conductor is provided in the inner region surrounded by the outer region of the substrate, at least a part of the low melting point conductor is positioned between the pair of external terminals when viewed in a direction normal to the substrate, and the low melting point conductor is electrically insulated from at least one of the pair of external terminals.

Advantageous Effect of Invention

Even when a part of a plurality of the thermoelectric conversion modules fails by being exposed to a higher temperature, the thermoelectric conversion module provided according to the exemplary embodiment of the present disclosure enables continued use of a thermoelectric generation system by effecting use of those normally working thermoelectric conversion modules.

DESCRIPTION OF EMBODIMENT

Prior to description of an embodiment of the present disclosure, a description is provided of findings that underlie the present disclosure and have been obtained by the inventors of the present application.

Figure 8A:
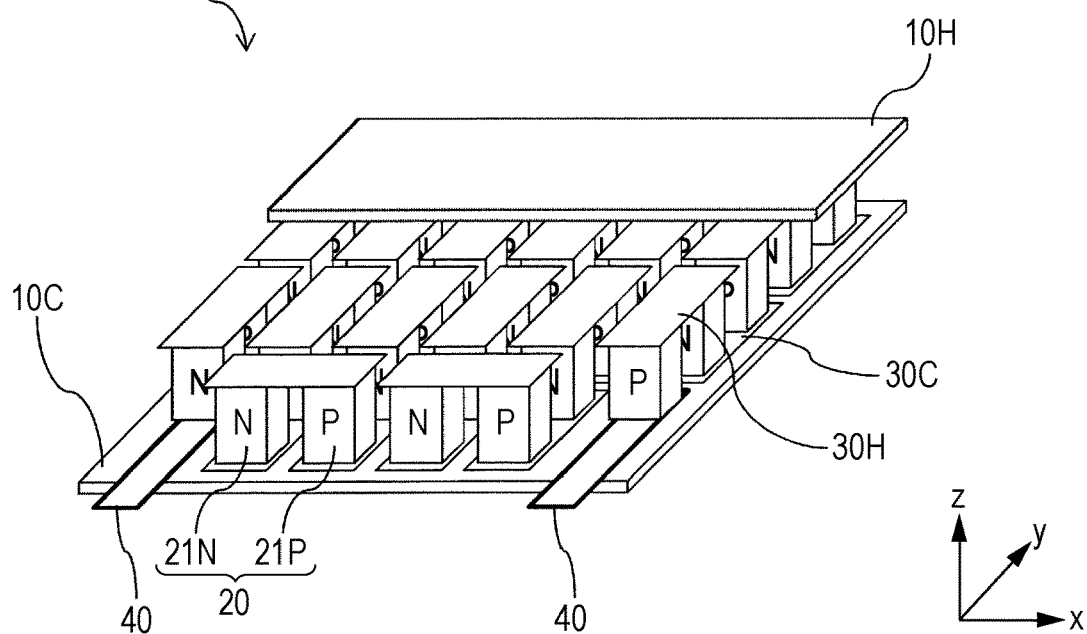
FIG. 8A is an oblique projection schematically illustrating typical configuration of conventional thermoelectric conversion module 200.
Figure 8B:
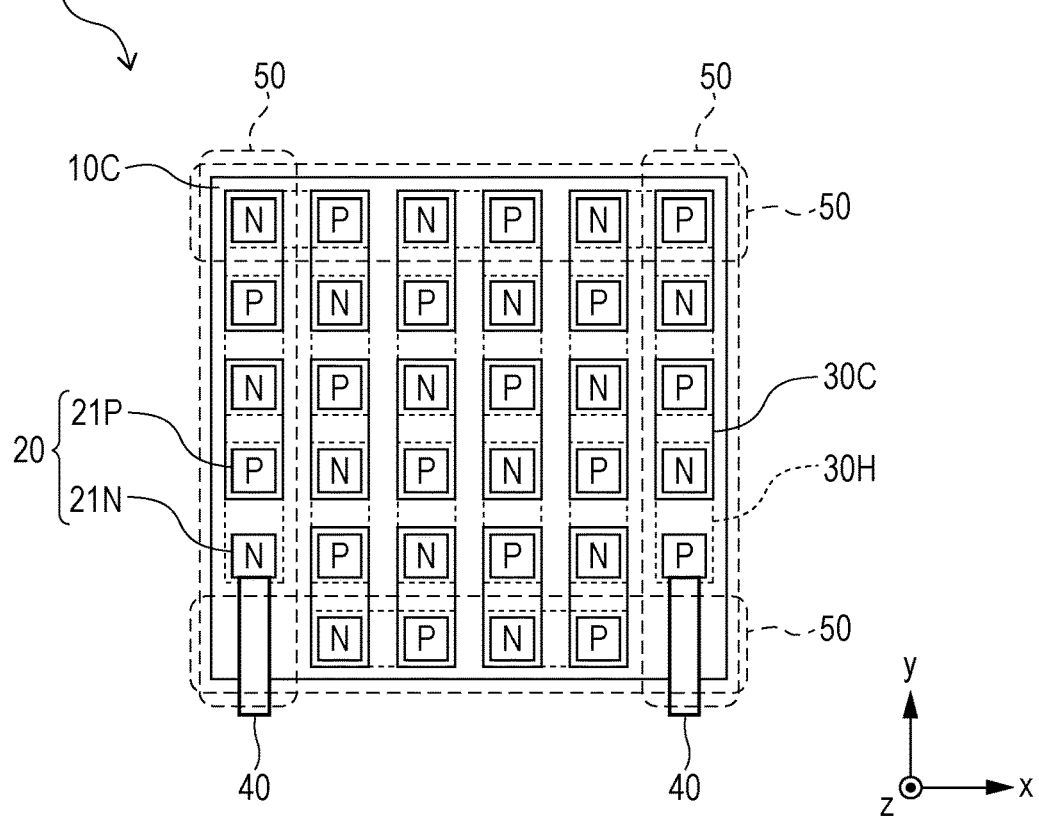
FIG. 8B is a plan view schematically illustrating the configuration of conventional thermoelectric conversion module 200.

FIG. 8A schematically illustrates typical configuration of conventional thermoelectric conversion module 200. FIG. 8B schematically illustrates how a plurality of thermoelectric conversion element pairs 20 are arranged and interconnected above substrate 10C that is positioned near a low-temperature heat source when thermoelectric conversion module 200 is viewed in a direction normal to the substrate (in a z direction in the figure). The configuration of conventional thermoelectric conversion module 200 is disclosed, for example, in NPL 1. A part of substrate 10H positioned near a high-temperature heat source is omitted from FIG. 8A to avoid complication of the figure.

Thermoelectric conversion module 200 includes high-temperature-heat-source-side substrate 10H, low-temperature-heat-source-side substrate 10C, the plurality of thermoelectric conversion element pairs 20 held between the substrates, and a pair of external terminals 40. High-temperature-heat-source-side substrate 10H and low-temperature-heat-source-side substrate 10C are hereinafter sometimes described simply as substrate 10H and substrate 10C, respectively. These substrates are at least surfaced with an insulator material. Thermoelectric conversion element pairs 20 each have p-type thermoelectric conversion element 21P and n-type thermoelectric conversion element 21N. P-type thermoelectric conversion elements 21P and n-type thermoelectric conversion elements 21N are arranged, for example, in a grid pattern above low-temperature-heat-source-side substrate 10C. The plurality of thermoelectric conversion element pairs 20 are electrically connected in series by interconnections 30H provided at substrate 10H and interconnections 30C provided at substrate 10C. P-type thermoelectric conversion elements 21P and n-type thermoelectric conversion elements 21N are joined to interconnections 30H and 30C by, for example, solder or an adhesive.

The pair of external terminals 40 is intended to input or output electric power to or from thermoelectric conversion module 200. The pair of external terminals 40 is electrically connected to the plurality of thermoelectric conversion element pairs 20 being connected in series. Typically, the pair of external terminals 40 is respectively disposed at corners of substrate 10C as illustrated in FIG. 8A in consideration of efficiency of the arrangement of the plurality of thermoelectric conversion element pairs 20 and efficiency of interconnection.

Heating substrate 10H and cooling substrate 10C, in other words, heating substrate 10H and rendering substrate 10C unheated cause p-type thermoelectric conversion element 21P and n-type thermoelectric conversion element 21N of thermoelectric conversion element pair 20 to have a temperature difference. Electromotive force is thus generated through the Seebeck effect. Thermoelectric conversion module 200 converts thermal energy into electric power. The electric power generated inside thermoelectric conversion module 200 can be extracted at the pair of external terminals 40.

When electric current is injected into thermoelectric conversion module 200 at the pair of external terminals 40, through the Peltier effect this time, a surface of substrate 10C, for example, absorbs heat, while a surface of substrate 10H radiates heat. Thermoelectric conversion module 200 thus converts electric power into thermal energy. In this way, thermoelectric conversion module 200 is also capable of cooling or heating using electric power.

Due to, for example, a cooling malfunction, thermoelectric conversion module 200 may be heated to a higher temperature compared to when operating normally. In that case, a crack is easily caused at a junction between the thermoelectric conversion element and the interconnection due to thermal expansion. This is conceivably attributable to a difference between respective thermal expansion coefficients of materials or a difference between respective thermal expansion coefficients of materials. Such failure of even one of the plurality of thermoelectric conversion element pairs 20 results in electrical disconnection of thermoelectric conversion module 200. Consequently, thermoelectric conversion module 200 does not function.

A plurality of thermoelectric conversion modules 200 can be used to compose, for example, a thermoelectric generation system. In the thermoelectric generation system, the plurality of thermoelectric conversion modules are electrically connected typically in series. With more thermoelectric conversion modules connected, more electric power is generated.

Suppose that one of the plurality of thermoelectric conversion modules 200 is disconnected. In that case, electrical discontinuity results in the entire thermoelectric generation system even if remaining thermoelectric conversion modules 200 are not disconnected. In cases where, for example, thermoelectric conversion module 200 is exposed to a temperature equal to or higher than a specified temperature, the thermoelectric generation system does not function.

Devised for solving the above problem are techniques of short-circuiting a pair of external terminals 40 to maintain electrical continuity of the entire system. The technique disclosed in PTL 1 uses an electric conduction part only under a higher temperature condition to short-circuit current introduction terminals. When a thermoelectric conversion module is heated to a higher temperature, inner joining material melts. Accordingly, a substrate sinks, whereby the thermoelectric conversion module has a decreased thickness. Using this phenomenon, the current introduction terminals short-circuit only when the higher temperature is reached by making electrical contact with the electric conduction part. Disclosed in PTL 2 is a thermal short circuit element that operates in an atmosphere with a temperature equal to or higher than a melting point of a meltable conductor that melts at the high temperature. The meltable conductor melts and solidifies in the atmosphere with the temperature equal to or higher than the melting point of the meltable conductor, thereby short-circuiting two adjacent electrodes.

As described above, in the configuration of conventional thermoelectric conversion module 200, the pair of external terminals 40 is positioned particularly at the respective corners formed by outer region 50 of the module. In this specification, outer region 50 corresponds to a region that is included in an entire region of the substrate and is indicated by a broken line. This region is where among the plurality of thermoelectric conversion element pairs 20 arranged in the grid pattern, an outermost group of thermoelectric conversion element pairs 20 is disposed.

Figure 9:
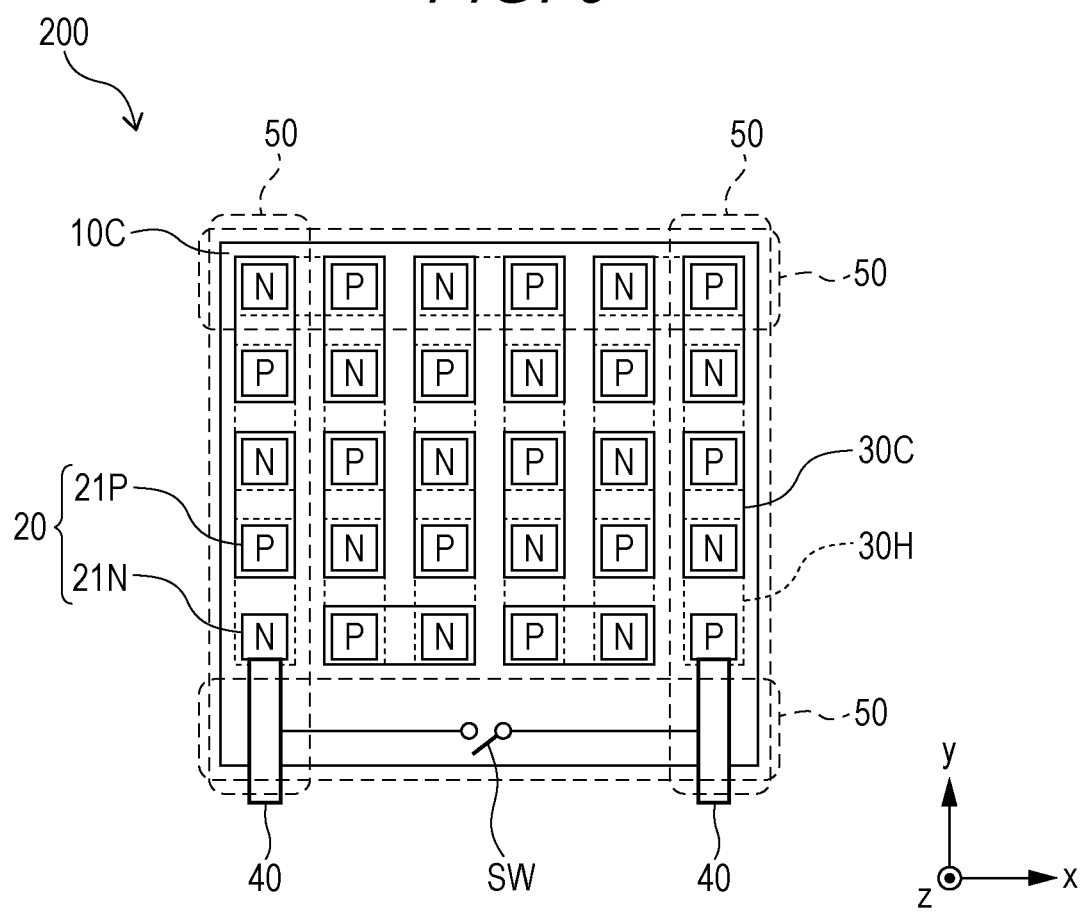
FIG. 9 is a plan view schematically illustrating configuration of thermoelectric conversion module 200 mounted with switch SW that short-circuits a pair of external terminals 40.

FIG. 9 schematically illustrates configuration of thermoelectric conversion module 200 mounted with switch SW that is capable of short-circuiting a pair of external terminals 40. Switch SW may be, for example, a meltable conductor as in PTL 2. The configuration illustrated in FIG. 9 can be obtained by replacement of thermoelectric conversion element pairs 20 positioned between the pair of external terminals 40 by switch SW. In this configuration, switch SW is disposed between the pair of external terminals 40. With the simple replacement as such, switch SW is consequently disposed in outer region 50 of substrate 10C.

Heat is actually radiated even from sides of thermoelectric conversion module 200, so that outer region 50 is not easily heated to a higher temperature than near a center of substrate 10C. A center of thermoelectric conversion module 200 and a vicinity of thermoelectric conversion module 200 are caused by, for example, a cooling malfunction to reach the temperature at which electrical disconnection takes place among the plurality of thermoelectric conversion element pairs 20. Even in this case, there is a possibility that outer region 50 does not reach that temperature. As such, with switch SW just being provided as in the conventional configuration, there is a high possibility that switch SW intended to short-circuit the pair of external terminals 40 does not function normally. In the conventional configuration, the pair of external terminals 40 is disposed apart from each other. As such, just providing switch SW between these terminals is conceivably not enough to effect a short circuit between the terminals.

Providing switch SW on low-temperature-heat-source-side substrate 10C as in the conventional configuration causes a problem that a sufficient quantity of heat is not transmitted to cause switch SW to function. As shown in NPL 1, the pair of external terminals 40 is generally provided on low-temperature-heat-source-side substrate 10C. One reason for this is that if the external terminals are provided on high-temperature-heat-source-side substrate 10H, these external terminals function as heat sinks, easily radiating heat.

When a thermoelectric conversion module is exposed to a higher temperature, a technique of accurately causing a short circuit between a pair of external terminals is desired. Based on the above findings, the inventors of the present application have thought of providing a low melting point conductor in an inner region surrounded by an outer region of a high-temperature-heat-source-side substrate and thus have come to the present disclosure.

EXEMPLARY EMBODIMENT

With reference to the accompanying drawings, a description is hereinafter provided of a thermoelectric conversion module according to the embodiment of the present disclosure.

Figure 1:
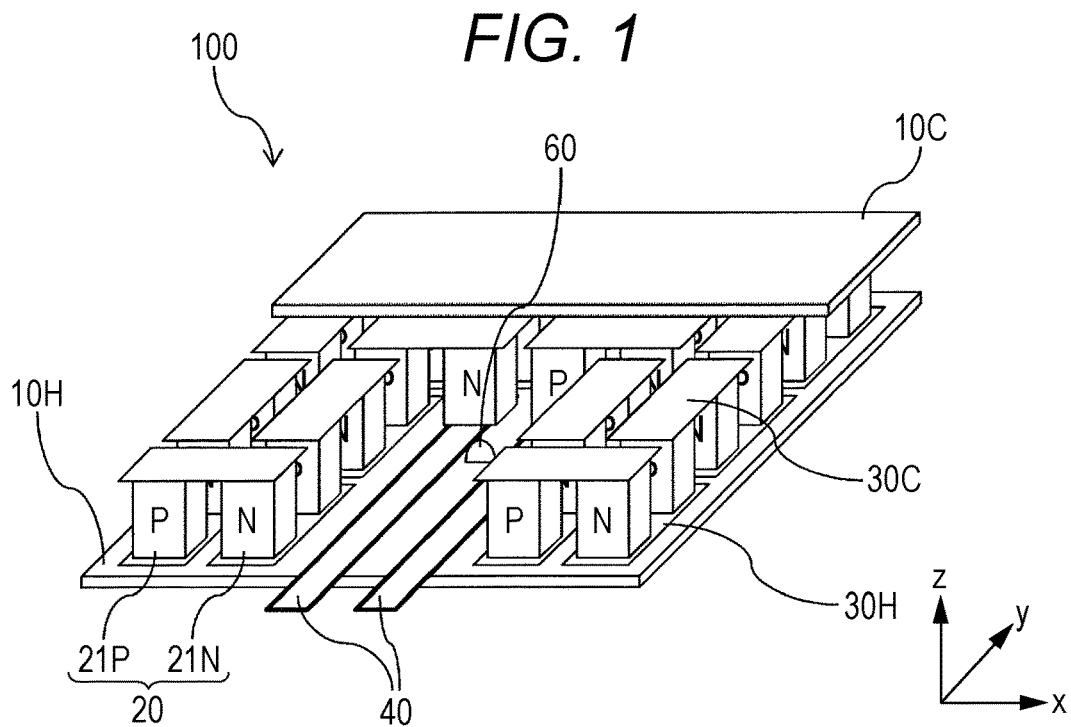
FIG. 1 is an oblique projection schematically illustrating configuration of thermoelectric conversion module 100 according to an exemplary embodiment.
Figure 2:
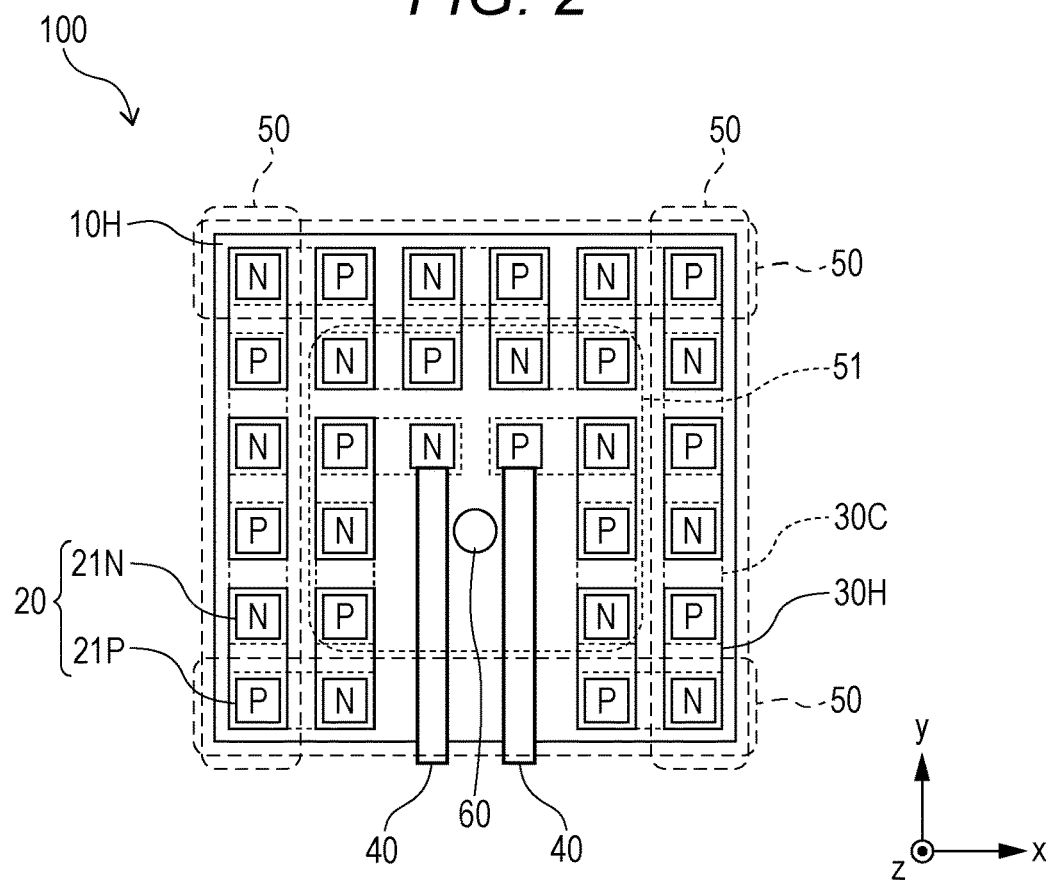
FIG. 2 is a plan view schematically illustrating the configuration of thermoelectric conversion module 100 according to the exemplary embodiment.

FIG. 1 schematically illustrates configuration of thermoelectric conversion module 100 according to the present embodiment. A part of substrate 10C positioned near a low-temperature heat source is omitted from FIG. 1 to avoid complication of the figure. FIG. 2 schematically illustrates how a plurality of thermoelectric conversion element pairs 20 are arranged and interconnected above substrate 10H that is positioned near a high-temperature heat source when thermoelectric conversion module 100 is viewed in a direction normal to substrate 10H (in a z direction in the figure). In this specification, thermoelectric conversion module 100 including two substrates 10H and 10C that are respectively positioned near the high-temperature heat source and the low-temperature heat source is taken as an example to describe the embodiment of the present disclosure. However, there is also a known thermoelectric conversion module that does not include low-temperature-heat-source-side substrate 10C. Such a module is sometimes called "half-skeleton type". The thermoelectric conversion module of the half-skeleton type also falls within the scope of the present disclosure. Duplication of descriptions of the above conventional configuration is hereinafter omitted.

Thermoelectric conversion module 100 includes high-temperature-heat-source-side substrate 10H, low-temperature-heat-source-side substrate 10C, the plurality of thermoelectric conversion element pairs 20, a pair of external terminals 40, and low melting point conductor 60. High-temperature-heat-source-side substrate 10H and low-temperature-heat-source-side substrate 10C are not each limited to a particular material, provided that substrates 10H and 10C at least have electrically insulated surfaces, respectively. However, a material with high thermal conductivity and high heat resistance is preferable. Aluminum oxide, for example, can be used as a suitable material.

The plurality of thermoelectric conversion element pairs 20, or more specifically a plurality of p-type thermoelectric conversion elements 21P and a plurality of n-type thermoelectric conversion elements 21N, are typically arranged in a grid pattern above high-temperature-heat-source-side substrate 10H. Substrates 10C and 10H each have an x-direction dimension ranging, for example, from 1 cm to 6 cm. A y-direction dimension of each of substrates 10C and 10H ranges, for example, from 1 cm to 6 cm. An x-direction dimension of each of p-type thermoelectric conversion element 21P and n-type thermoelectric conversion element 21N ranges, for example, from 1.0 mm to 3.0 mm. A y-direction dimension of each of p-type thermoelectric conversion element 21P and n-type thermoelectric conversion element 21N ranges, for example, from 1.0 mm to 3.0 mm. A z-direction dimension of each of p-type thermoelectric conversion element 21P and n-type thermoelectric conversion element 21N ranges, for example, about from 1.0 mm to 3.0 mm. It is to be noted that the arrangement and the interconnection of the plurality of thermoelectric conversion element pairs 20 are not limited to the illustrated example.

Each of p-type thermoelectric conversion element 21P and n-type thermoelectric conversion element 21N includes at least a thermoelectric conversion material. The thermoelectric conversion material is not limited to a particular kind. The thermoelectric conversion material can be selected based on, for example, an intended temperature of use. In cases where thermoelectric conversion module 100 is used in a temperature range about between room temperature and 200° C., a Bi—Te material is preferable. In cases where thermoelectric conversion module 100 is used in a temperature range about between 200° C. and 500° C., a Pb—Te material, a Co—Sb material, a Zn—Sb material, or a Mg—Sb material is preferable. In cases where thermoelectric conversion module 100 is used in a temperature range about between 500° C. and 1000° C., a Si—Ge material is preferable.

Figure 3:
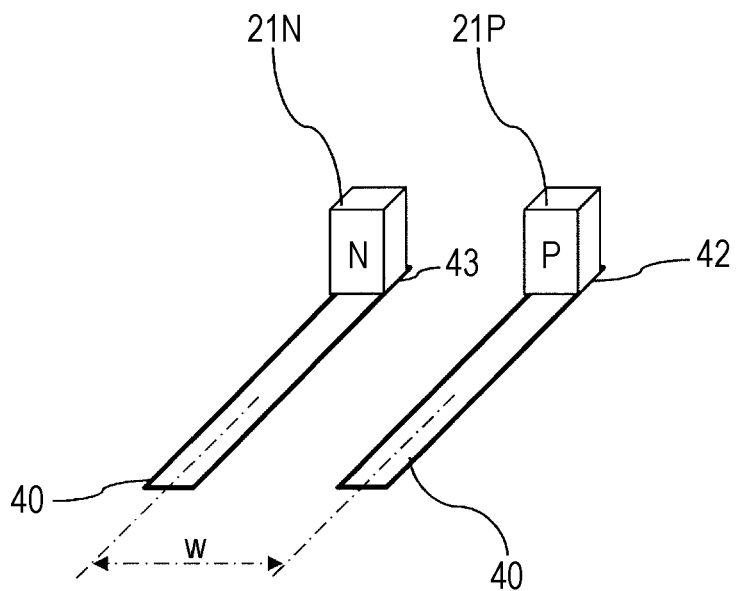
FIG. 3 is an enlarged view schematically illustrating a pair of external terminals 40 and p-type and n-type thermoelectric conversion elements 21P and 21N electrically connected to the pair of external terminals 40.

FIG. 3 is an enlarged illustration of the pair of external terminals 40 and p-type and n-type thermoelectric conversion elements 21P and 21N electrically connected to the pair of external terminals 40. As illustrated in FIG. 2, the pair of external terminals 40 is provided on high-temperature-heat-source-side substrate 10H. The pair of external terminals 40 is intended to extract electric power generated in the plurality of thermoelectric conversion element pairs 20. The pair of external terminals 40 is disposed in proximity to each other on substrate 10H with space w in between. Space w is equal to, for example, a space between p-type thermoelectric conversion element 21P and n-type thermoelectric conversion element 21N of thermoelectric conversion element pair 20.

One of the pair of external terminals 40 includes first connecting part 42 having a contact surface touching p-type thermoelectric conversion element 21P. First connecting part 42 electrically connects with p-type thermoelectric conversion element 21P positioned at one end of the plurality of thermoelectric conversion element pairs 20 being connected in series. The other of the pair of external terminals 40 includes second connecting part 43 having a contact surface touching n-type thermoelectric conversion element 21N. Second connecting part 43 electrically connects with n-type thermoelectric conversion element 21N positioned at the other end of the plurality of thermoelectric conversion element pairs 20. As illustrated in FIG. 2, first and second connecting parts 42 and 43 are positioned in inner region 51 surrounded by outer region 50 of substrate 10H. Moreover, first and second connecting parts 42 and 43 are in proximity to each other around a center of substrate 10H. The center of substrate 10H corresponds to an intersection point of diagonal lines of the substrate that is substantially rectangular. First and second connecting parts 42 and 43, however, do not necessarily need to be positioned around the center and have only to be in inner region 51 of substrate 10H.

Interconnections 30H and 30C and the pair of external terminals 40 are not each limited to a particular material. However, a material with high electrical conductivity and high heat resistance is preferable. A copper or silver interconnection, for example, is a usable material. A width of each of interconnections 30H and 30C and the pair of external terminals 40 is appropriately determined based on an amount of electric current that may flow through thermoelectric conversion module 100.

Low melting point conductor 60 is provided in inner region 51 of substrate 10H. At least a part of low melting point conductor 60 may be positioned between the pair of external terminals 40 when viewed in the direction normal to substrate 10H (in the z direction in FIG. 2). As illustrated in FIG. 2, low melting point conductor 60 is positioned, for example, between the pair of external terminals 40. Low melting point conductor 60 is preferably provided around the center of substrate 10H. This improves transmission of heat to low melting point conductor 60 when thermoelectric conversion module 100 is exposed to a higher temperature. Consequently, a short circuit can be effected more accurately between the pair of external terminals 40.

Figure 4A:
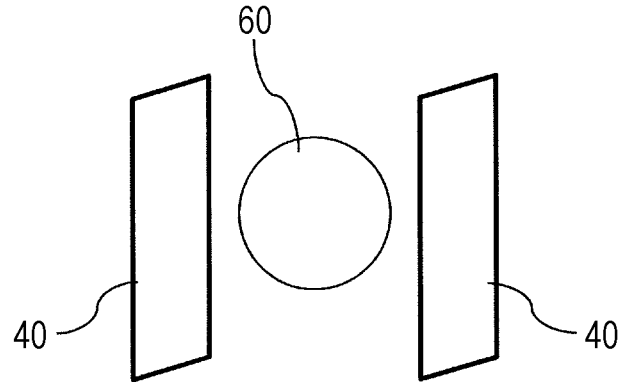
FIG. 4A is an enlarged view schematically illustrating low melting point conductor 60 provided on substrate 10H.
Figure 4B:
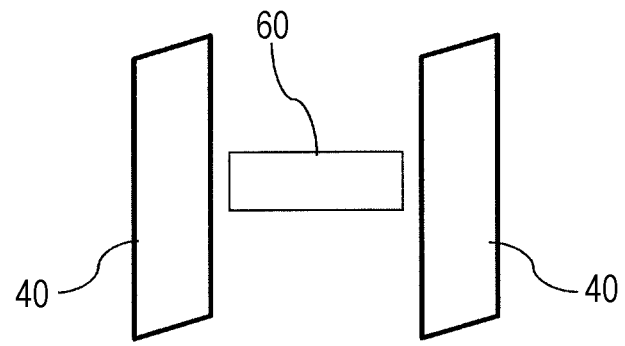
FIG. 4B is an enlarged view schematically illustrating low melting point conductor 60 provided on substrate 10H.
Figure 5:
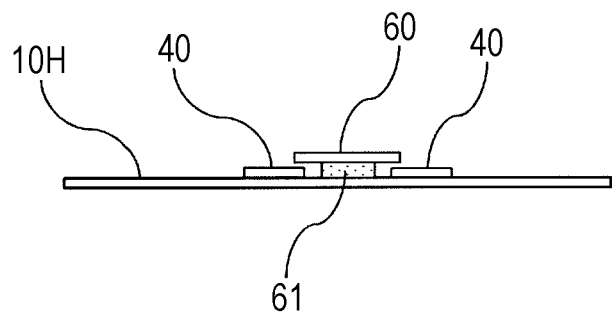
FIG. 5 schematically illustrates low melting point conductor 60 that is supported by support 61 provided between the pair of external terminals 40.

FIGS. 4A and 4B are enlarged illustrations each illustrating low melting point conductor 60 provided on substrate 10H. FIG. 5 illustrates low melting point conductor 60 that is supported by support 61 provided between the pair of external terminals 40. Low melting point conductor 60 has the shape of, for example, a dome or a rectangular column. In an atmosphere with a temperature lower than a melting point of low melting point conductor 60, low melting point conductor 60 is electrically insulated from at least one of the pair of external terminals 40. As illustrated in the drawings, low melting point conductor 60 is spaced apart from the pair of external terminals 40 and thus can be electrically insulated. Alternatively, low melting point conductor 60 may be in contact with one of the pair of external terminals 40 while being spaced apart from the other of the pair of external terminals 40. In either case, the pair of external terminals 40 does not short-circuit. Low melting point conductor 60 thus does not affect module operation, namely, inputting or outputting of electric current. Thermoelectric conversion module 100 operates like conventional thermoelectric conversion module 200 in an atmosphere with a temperature equal to or lower than the melting point of low melting point conductor 60.

In a method for electrically insulating low melting point conductor 60, as illustrated in FIG. 5, support 61 may be provided between the pair of external terminals 40. Electrical insulation of low melting point conductor 60 may be achieved by mounting low melting point conductor 60 that is, for example, plate-shaped on support 61. In this case, when viewed in the direction normal to substrate 10H (in the z direction in FIG. 2), at least a part of low melting point conductor 60 is positioned between the pair of external terminals 40, while remaining low melting point conductor 60 lies above the pair of external terminals 40. Instead of being spaced apart from the pair of external terminals 40, low melting point conductor 60 may have an insulating film inserted between low melting point conductor 60 and the pair of external terminals 40 to be electrically insulated.

The melting point of low melting point conductor 60 is substantially equal to a heat-resistant temperature of p-type thermoelectric conversion element 21P or n-type thermoelectric conversion element 21N. More specifically, the melting point of low melting point conductor 60 satisfies at least one of the following Formula (I) and Formula (II).

$$Tp \times 0.90 \leq Tm \leq Tp \times 1.1 \qquad (I)$$

$$Tn \times 0.90 \leq Tm \leq Tn \times 1.1 \qquad (II)$$

where Tm is the melting point of low melting point conductor 60, Tp is the heat-resistant temperature of p-type thermoelectric conversion element 21P, and Tn is the heat-resistant temperature of n-type thermoelectric conversion element 21N. The heat-resistant temperature is a temperature at which the plurality of thermoelectric conversion element pairs 20 are disconnected in series as a result of thermal expansion in at least one of the plurality of thermoelectric conversion element pairs 20.

The melting point of low melting point conductor 60 needs to be higher than a peak temperature that thermoelectric conversion module 100 is assumed to reach when used normally. For this reason, the melting point of low melting point conductor 60 is preferably about the same as the heat-resistant temperature at which module damage may be caused. Low melting point conductor 60 is, for example, a low melting point metal. Suppose that the Bi—Te material, for example, is used for the thermoelectric conversion element. In that case, thermoelectric conversion module 100 is often used normally in a temperature range of equal to or lower than 100° C. and is easily damaged at a temperature equal to or higher than 200° C. Accordingly, an In—Sn alloy or an In—Bi alloy, for example, is suitable as low melting point conductor 60. A melting point of the In—Sn alloy can be adjusted in a range between 117° C. and 232° C. through adjustment of a mixing ratio of In to Sn. A melting point of the In—Bi alloy can be adjusted in a range between 72° C. and 271° C. through adjustment of a mixing ratio of In to Bi.

Changing the thermoelectric conversion elements to use, for example, enables thermoelectric conversion module 100 to have enhanced heat resistance and to be used even at a higher temperature. In that case, a Sn—Sb alloy or a Sn—Cu alloy, for example, is suitable as low melting point conductor 60. A melting point of the Sn—Sb alloy can be adjusted in a range between 232° C. and 630° C. through adjustment of a mixing ratio of Sn to Sb. A melting point of the Sn—Cu alloy can be adjusted in a range between 223° C. and 1083° C. through adjustment of a mixing ratio of Sn to Cu.

According to one aspect, low melting point conductor 60 is an In—Sn alloy. The melting point of this In—Sn alloy ranges from 200° C. to 232° C., inclusive. Each of p-type thermoelectric conversion element 21P and n-type thermoelectric conversion element 21N is formed of the Bi—Te material.

Figure 6:
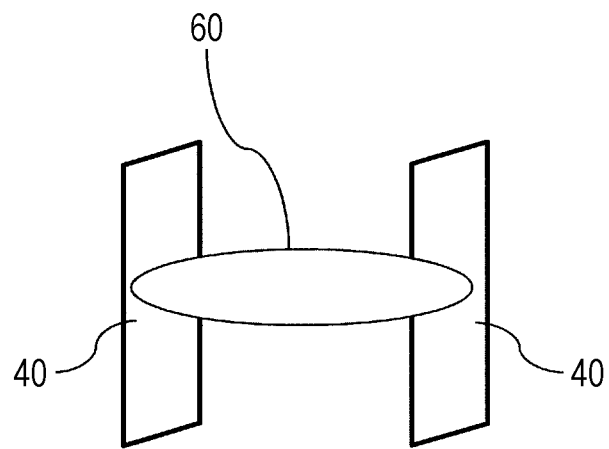
FIG. 6 schematically illustrates the pair of external terminals 40 being short-circuited by molten low melting point conductor 60.

FIG. 6 schematically illustrates the pair of external terminals 40 being short-circuited by molten low melting point conductor 60.

In an atmosphere with a temperature equal to or higher than the melting point of low melting point conductor 60, low melting point conductor 60 is molten to short-circuit the pair of external terminals 40. For example, a cooling malfunction near a low-temperature heat source may cause heat to grow inside thermoelectric conversion module 100 compared to when thermoelectric conversion module 100 is used normally. Accordingly, module temperature may rise close to a temperature limit. Because of having the melting point that is about the same as the heat-resistant temperature, low melting point conductor 60 may melt and diffuse. Molten low melting point conductor 60 makes electrical contact with both of the pair of external terminals 40 and thereby short-circuits the pair of external terminals 40. Low melting point conductor 60 has electrical conductivity whether low melting point conductor 60 is in a liquid state or in a solid state. Once melted, low melting point conductor 60 may remain in the solid or liquid state, depending on internal temperature of the module. In a thermoelectric generation system, damaged thermoelectric conversion module 100 no longer functions; however, electrical continuity is ensured among the plurality of thermoelectric conversion modules 100 being connected in series. Continued use of the thermoelectric generation system is thus enabled as long as remaining thermoelectric conversion modules 100 are not damaged.

According to the present embodiment, low melting point conductor 60 is provided in inner region 51 of substrate 10H, and the pair of external terminals 40 are disposed in proximity to each other. As such, effect of heat radiation from sides of thermoelectric conversion module 100 can be reduced. Consequently, thermoelectric conversion module 100 operates more accurately than conventional thermoelectric conversion module 200 when the module temperature rises close to the temperature limit.

Figure 7:
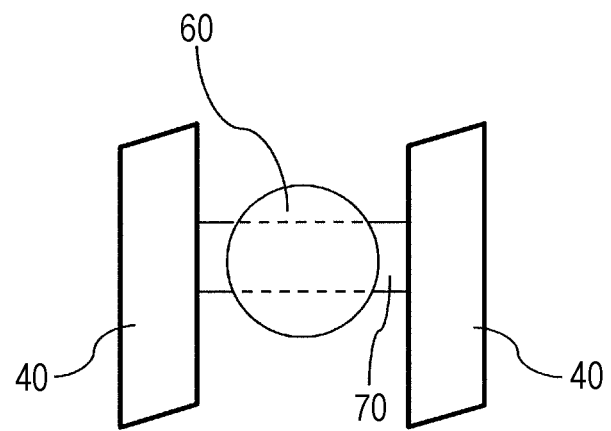
FIG. 7 schematically illustrates groove 70 that is provided in substrate 10H to guide molten low melting point conductor 60.

FIG. 7 illustrates groove 70 that is provided in substrate 10H to guide molten low melting point conductor 60.

Substrate 10H may include groove 70 that guides molten low melting point conductor 60. In that case, at least a part of low melting point conductor 60 is provided in groove 70. With groove 70 being provided, diffusion of molten low melting point conductor 60 can be limited to an area that is necessary and sufficient for a short circuit between the pair of external terminals 40. In this way, thermoelectric conversion module 100 can be caused to operate even more accurately.

In the configuration described in the present embodiment, single low melting point conductor 60 is provided on substrate 10H. However, the present disclosure is not limited to this. One or more low melting point conductors (not illustrated) may be provided as an addition between the pair of external terminals 40. As such, even when one of the low melting point conductors does not function well, the other low melting point conductors function and thereby can short-circuit the pair of external terminals 40 more accurately.

Thermoelectric conversion module 100 can be composed of the same elements as those of conventional thermoelectric conversion module 200 except for low melting point conductor 60. As such, a wide variety of publicly known methods can be used for manufacture of thermoelectric conversion module 100. Low melting point conductor 60 may be mounted by a method such as soldering or printed wiring.

INDUSTRIAL APPLICABILITY

A thermoelectric conversion module according to the present disclosure can be suitably used in a thermoelectric conversion apparatus that carries out interconversion between thermal energy and electric power.

REFERENCE SIGNS LIST 10H, 10C: substrate
20: thermoelectric conversion element pair
21P: p-type thermoelectric conversion element
21N: n-type thermoelectric conversion element
30H, 30C: interconnection
40: a pair of external terminals
42: first connecting part
43: second connecting part
50: outer region
51: inner region
60: low melting point conductor
61: support
70: groove
100: thermoelectric conversion module

The invention claimed is:
1. A thermoelectric conversion module comprising:
a substrate;
a plurality of thermoelectric conversion element pairs electrically connected in series, the plurality of thermoelectric conversion element pairs being provided on the substrate;
a pair of external terminals that carries out inputting or outputting of electric power, the pair of external terminals being provided on the substrate; and
a low melting point conductor, wherein
each of the plurality of thermoelectric conversion element pairs has a p-type thermoelectric conversion element and an n-type thermoelectric conversion element,
the low melting point conductor has a melting point that is substantially equal to a heat-resistant temperature of the p-type thermoelectric conversion element or the n-type thermoelectric conversion element,
one of the pair of external terminals has a first connecting part electrically connecting with the p-type thermoelectric conversion element positioned at one end of the plurality of thermoelectric conversion element pairs, whereas the other of the pair of external terminals has a second connecting part electrically connecting with the n-type thermoelectric conversion element positioned at the other end of the plurality of thermoelectric conversion element pairs,
the first connecting part and the second connecting part are positioned in an inner region surrounded by an outer region of the substrate,
the outer region includes a surface region of the substrate with the surface region being provided with an outermost plurality of the p-type thermoelectric conversion elements and an outermost plurality of the n-type thermoelectric conversion elements,
the low melting point conductor is provided in the inner region surrounded by the outer region of the substrate,
at least a part of the low melting point conductor is positioned between the pair of external terminals when viewed in a direction normal to the substrate, and
the low melting point conductor is electrically insulated from at least one of the pair of external terminals.

2. The thermoelectric conversion module according to claim 1, wherein the substrate is positioned near a high-temperature heat source and is provided with the pair of external terminals.

3. The thermoelectric conversion module according to claim 1, wherein the low melting point conductor is provided between the pair of external terminals on the substrate.

4. The thermoelectric conversion module according to claim 1, wherein the melting point of the low melting point conductor satisfies at least one of the following Formula (I) and Formula (II):

$$Tp \times 0.90 \leq Tm \leq Tp \times 1.1 \quad (I)$$

$$Tn \times 0.90 \leq Tm \leq Tn \times 1.1 \quad (II)$$

where Tm is the melting point, Tp is the heat-resistant temperature of the p-type thermoelectric conversion element, and Tn is the heat-resistant temperature of the n-type thermoelectric conversion element.

5. The thermoelectric conversion module according to claim 1, wherein the low melting point conductor is an alloy selected from the group consisting of an In—Sn alloy, an In—Bi alloy, a Sn—Sb alloy, and a Sn—Cu alloy.

6. The thermoelectric conversion module according to claim 1, wherein the melting point of the low melting point conductor falls within a range of not less than 200° C. and not more than 232° C.

7. The thermoelectric conversion module according to claim 6, wherein:
each of the p-type thermoelectric conversion element and the n-type thermoelectric conversion element is formed of a Bi—Te material; and
the low melting point conductor is an In—Sn alloy.

8. The thermoelectric conversion module according to claim 1, wherein the low melting point conductor is provided at a center of the substrate.

9. The thermoelectric conversion module according to claim 2, further comprising a substrate positioned near a low-temperature heat source,
wherein the plurality of thermoelectric conversion element pairs are held between the substrates positioned near the high-temperature heat source and the low-temperature heat source.

10. The thermoelectric conversion module according to claim 1, wherein a space between the pair of external terminals is equal to a space between the p-type thermoelectric conversion element and the n-type thermoelectric conversion element of each of the plurality of thermoelectric conversion element pairs.

11. The thermoelectric conversion module according to claim 1, further comprising another low melting point conductor provided between the pair of external terminals.

12. The thermoelectric conversion module according to claim 1, wherein the low melting point conductor is electrically insulated from the at least one of the one and the other of the pair of external terminals in an atmosphere with a temperature lower than the melting point of the low melting point conductor.

13. The thermoelectric conversion module according to claim 1, wherein the heat-resistant temperature is a temperature at which a series connection of the plurality of thermoelectric conversion element pairs is disconnected due to thermal expansion in at least one of the plurality of thermoelectric conversion element pairs.

14. The thermoelectric conversion module according to claim 1, wherein in an atmosphere with a temperature equal to or higher than the melting point of the low melting point conductor, the low melting point conductor is molten to short-circuit the pair of external terminals.

15. The thermoelectric conversion module according to claim 1, wherein:
the substrate has a groove that guides the low melting point conductor that has been molten; and
at least a part of the low melting point conductor is provided in the groove.

* * * * *